(12) United States Patent
Farjad-Rad

(10) Patent No.: US 6,794,946 B2
(45) Date of Patent: Sep. 21, 2004

(54) FREQUENCY ACQUISITION FOR DATA RECOVERY LOOPS

(76) Inventor: Ramin Farjad-Rad, 405 Mountain Laurel Ct., Mountain View, CA (US) 94043

(*) Notice: Subject to any disclaimer, the term of this patent is extended or adjusted under 35 U.S.C. 154(b) by 37 days.

(21) Appl. No.: 09/862,368

(22) Filed: May 22, 2001

(65) Prior Publication Data

US 2001/0048299 A1 Dec. 6, 2001

Related U.S. Application Data

(60) Provisional application No. 60/206,191, filed on May 22, 2000.

(51) Int. Cl.[7] .............................................. H03L 7/00
(52) U.S. Cl. .................... 331/16; 375/376; 327/156; 331/17
(58) Field of Search ............... 331/16, 17; 375/376; 327/156

(56) References Cited

U.S. PATENT DOCUMENTS 4,787,097 A * 11/1988 Rizzo ........................ 327/156
6,369,660 B1 * 4/2002 Wei et al. ................... 327/156

OTHER PUBLICATIONS

Lee, Thomas H., et al., "A 155–MHZ Clock Recovery Delay—and Phase–Locked Loop," pp. 421–430, Reprinted from IEEE Journal of Solid–State Circuits, vol. SC–27, pp. 1736–1746, Dec. 1992.
Soyuer, Mehmet, "A Monolithic 2.3–Gb/s 100–mW Clock and Data Recovery Circuit in Silicon Bipolar Technology," pp. 450–453, Reprinted from IEEE Journal of Solid–State Circuits, vol. SC–28, pp. 1310–1313, Dec. 1993.
Savoj, Jafar, et al., "A 10–Gb/s CMOS Clock and Data Recovery Circuit," IEEE, pp. 136–139.

Poulton, John, et al., "A Tracking Clock Recovery Receiver for 4Gb/s Signaling," pp. 157–169.
Hu, Timothy H., "A Monolithic 480 Mb/s Parallel AGC/Decision/Clock–Recovery Circuit in 1.2–$\mu$m CMOS," pp. 437–443, Reprinted from IEEE Journal of Solid–State Circuits, vol. SC–28, pp. 1314–1320, Dec. 1993.
Ishihara, Noboru, et al., "A Monolithic 156 Mb/s Clock and Data Recovery PLL Circuit Using the Same–and–Hold Technique," pp. 431–436, Reprinted from IEEE Journal of Solid–State Circuits, vol. SC–29, pp. 1566–1571, Dec. 1994.
Farjad–Rad, Ramin, et al., "A 0.3–$\mu$m CMOS 8–Gb/s 4–PAM Serial Link Transceiver," pp. 757–764, May 2000.
Fiedler, Alan, et al., "A 1.0625Gbps Transceiver with 2x–Oversampling and Transmit Signal Pre–Emphasis," IEEE, pp. 462–464.
Thon, L., "540Mhz 21 mW MDFE Equalizer and Detector in 0.25$\mu$m CMOS," IEEE, Feb. 7, 1998.

* cited by examiner

Primary Examiner—Arnold Kinkead
(74) Attorney, Agent, or Firm—Sawyer Law Group LLP

(57) ABSTRACT

A frequency monitor includes an edge detector which produces a pulse for each rising or falling edge of an error signal. The error signal itself has a frequency that is responsive to a difference between frequencies of two input signals. A switched capacitor circuit has an effective average resistance that depends on the rate or frequency of the edge detector output pulses. A capacitor holds a charge that depends on the effective average resistance of the resistive circuit. Finally, comparator produces an output based on the charge held by the capacitor. The comparator output indicates whether the difference between the two input signal frequencies is less than some predetermined amount. A selector, responsive to the comparator, selects from a data phase detector circuit and a frequency acquisition circuit to control an oscillator. The oscillator produces a clock signal at a sampling frequency, which is used by the detector circuit to receive data.

26 Claims, 5 Drawing Sheets

FREQUENCY ACQUISITION FOR DATA RECOVERY LOOPS

RELATED APPLICATION

This application claims the benefit of U.S. Provisional Application No. 60/206,191, filed on May 22, 2000. The entire teachings of the above application(s) are incorporated herein by reference.

BACKGROUND OF THE INVENTION

Monolithic data recovery phase locked loops (PLLs) require a large frequency capture range, due to the large frequency deviations of on-chip voltage-controlled oscillators (VCOs) caused by extensive process variations. As the capture range of a loop using only phase correction is limited, a frequency acquisition aid must be used.

One method that has been used is to directly measure the frequency of the VCO output, and when it is close to the target frequency, switch control of the VCO to the data recovery PLL. However, this requires extremely fast circuitry, especially at the high speeds (multi-gigabits per second) required in typical high-speed communication links.

SUMMARY OF THE INVENTION

The design employed by the present invention offers a new frequency acquisition technique which helps the main recovery PLL lock to data stream under considerable process variations.

Accordingly, a frequency monitor includes an edge detector which produces a pulse for each rising or falling edge of an error signal. The error signal itself has a frequency that is responsive to a difference between frequencies of two input signals. A resistive circuit has an effective average resistance that depends on the rate or frequency of the edge detector output pulses. A capacitor holds a charge that depends on the effective average resistance of the resistive circuit. Finally, an indicator circuit produces an output based on the charge held by the capacitor. The indicator circuit output indicates whether the difference between the two input signal frequencies is less than some predetermined amount.

The resistive circuit is implemented in one embodiment as a switched capacitor circuit that charges and discharges at a rate that depends on the rate of the edge detector output pulses.

The indicator circuit is implemented in one embodiment as a comparator that produces the indicator circuit output, which is at one of two levels based on the charge and some threshold, where one level indicating that the difference between the two input signal frequencies is less than a predetermined amount, and the second level indicating that said difference is greater than a predetermined amount.

Furthermore, a selector, responsive to the indicator circuit output, selects from plural sources, for example, a data phase detector circuit and a frequency acquisition circuit, to control an oscillator. The oscillator may be, for example, a voltage-controlled oscillator. It produces a clock signal at a sampling frequency, which is used by the detector circuit to receive data.

The frequency acquisition circuit compares the clock signal with a reference clock to produce a frequency acquisition output indicative of the difference between the frequencies of the reference clock and the oscillator clock signal. The output is one of the sources to the selector.

The data phase detector circuit compares the clock signal with a rate of incoming data to produce a data phase detector output indicative of the difference between the frequencies of the reference clock and the incoming data. The output another one of the sources to the selector.

In at least one embodiment, the data phase detector circuit output comprises the error signal.

In an alternate embodiment, the error signal is formed by a combiner circuit which combines the two input signals. For example, the combiner circuit can include a mixer which mixes the two input signals to produce a mixed signal, followed by a low-pass filter which filters the mixed signal to produce the error signal.

One advantage of the present invention is that the maximum frequency found in the present invention is equal to the difference between the frequencies of the input signal and the reference clock, which is considerably lower than the signal frequency. Thus, the acquisition loop can operate using standard CMOS technology.

Another advantage is that the frequency acquisition technique of the present invention can be used with any PLL regardless of its architecture. In other words, it is compatible with almost any PLL architecture.

Yet another advantage is that the existence of an input signal and frequency lock condition can be detected.

Finally, the overall architecture requires a very low transistor count and complexity.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
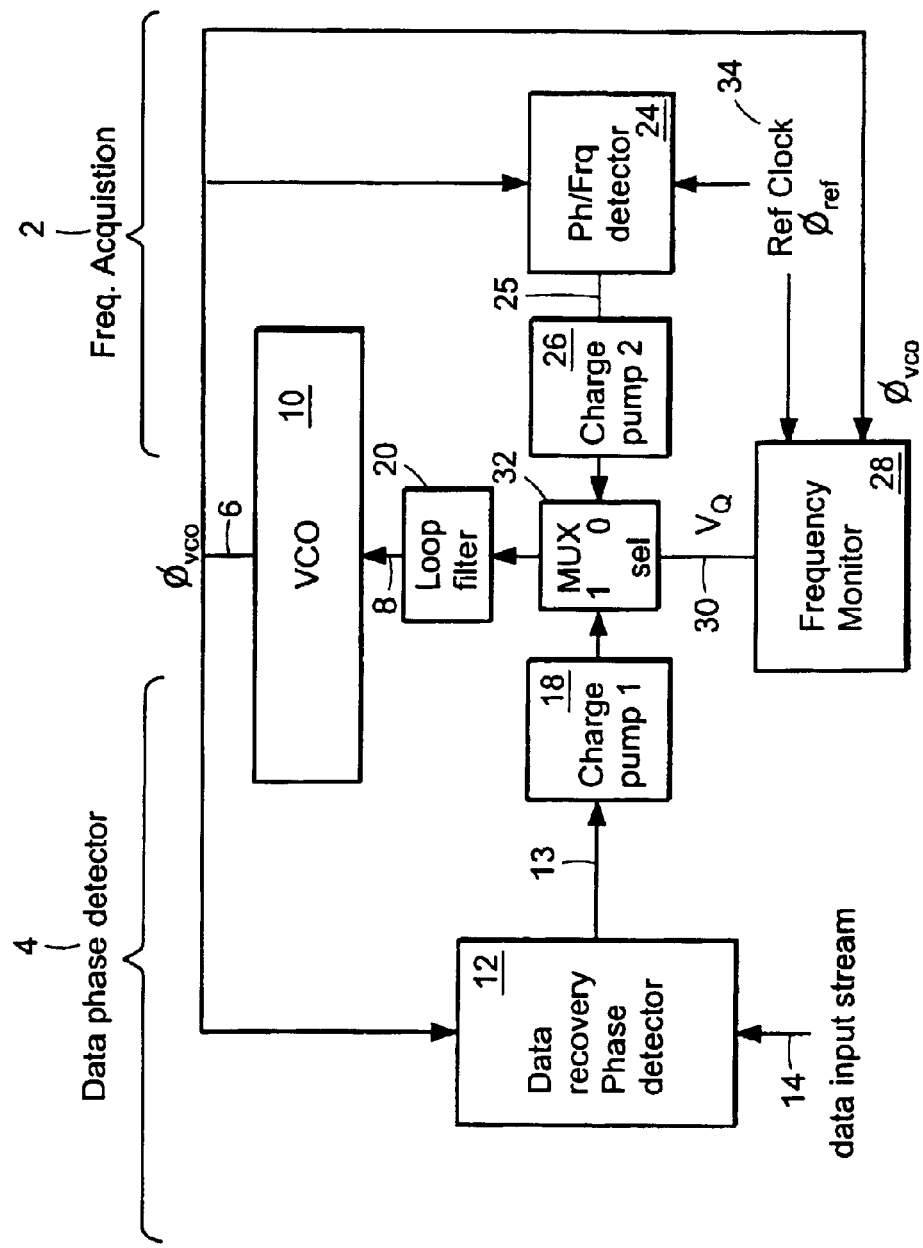
FIG. 1 is a block diagram of a combined phase detector and frequency acquisition loop, with the frequency monitor of an embodiment of the present invention.

FIG. 1 shows a phase detector circuit 4 together with the frequency acquisition circuit 2.

A voltage-controlled oscillator (VCO) 10 produces a sampling clock 6 at a frequency determined by a control voltage 8. The control voltage is driven by either the phase detector circuit 4 or the frequency acquisition circuit 2, as selected by the frequency monitor 28 through selector 32.

In the data phase detector circuit 4, a data recovery phase detector 12 determines the phase offset of data in an input stream 14 with respect to the sampling clock 6 and produces an error signal $V_{er}$ which is indicative of this phase offset.

The output signal 13 drives a first charge pump 18. The output of the charge pump 18, if selected by selector 32, is filtered by loop filter 20, resulting in the VCO control voltage 8.

At chip start-up, the frequency acquisition circuit 2 helps the phase detector circuit 4 acquire lock to a reference clock 34, which is typically available for transmitter clock generation. A standard phase/frequency detector 24 compares the reference clock 34 with the VCO output 6, or a subharmonic thereof, and produces a voltage 25 indicative of the frequency difference between the two signals. This voltage 25 then drives a second charge pump 26 whose output, if selected by selector 32, is filtered by loop filter 20, resulting in the VCO control voltage 8.

The frequency acquisition circuit 2 thus acts to rapidly force the VCO to operate close to the reference clock 34 frequency. During this time, selector 32 connects the second charge pump 26 to the loop filter 20 so that the frequency acquisition circuit 2 is driving the VCO 10.

The frequency monitor 28 continuously compares the frequency $f_{\phi ref}$ of the reference clock $\phi_{ref}$, which is close to the incoming data frequency, to the frequency $f_{\phi vco}$ of the VCO output $\phi_{vco}$ 6, and keeps the frequency acquisition circuit 2 active as long as the difference between the two frequencies, i.e., $f_{er}=f_{\phi ref}-f_{\phi vco}$, is greater than the frequency capture range of the data recovery circuit 14. When the frequency difference $f_{er}$ is less than the data recovery circuit capture range, the frequency monitor 28 asserts an indicator signal $V_Q$ 30 which causes selector 32 to switch the loop control from the frequency acquisition circuit 2 to the data recovery circuit 4.

Figure 2:
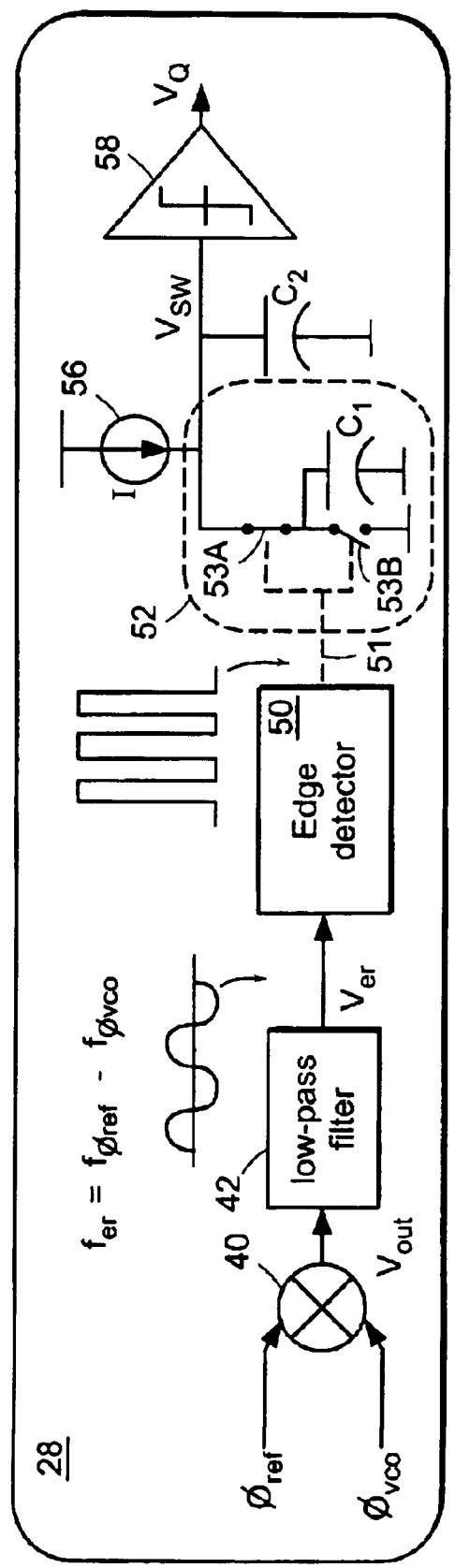
FIG. 2 is a simplified schematic diagram for the frequency monitor of FIG. 1.

FIG. 2 presents a simplified schematic of the frequency monitor 28 of FIG. 1. A mixer 40 combines the reference clock $\phi_{ref}$ (with frequency $f_{\phi ref}$) and the VCO output $\phi_{vco}$ (having frequency $f_{\phi vco}$) frequencies to produce a signal $V_{out}$ that contains two frequency components: $f_{\phi ref}-f_{\phi vco}$ and $f_{\phi ref}+f_{100\ vco}$. A low-pass filter 42 following the mixer suppresses the component at $f_{\phi ref}+f_{\phi vco}$ and passes the component at $f_{\phi vco}$ in its output $V_{er}$.

Edge detector 50 generates a full-swing pulse at 51 corresponding to each edge of $V_{er}$ at its input. Thus, the output of the edge detector 50 is a train of pulses at twice the input frequency $f_{er}$.

The output of the edge detector, shown as dotted line 51, is applied to a switched-capacitor circuit as shown in the dashed box 52 of FIG. 2, comprising capacitor $C_1$ and two complementary switches 53A and 53B, in which one switch turns off when the other switch is on. The effective conductance of the switched-capacitor structure is proportional to the value of capacitance $C_1$ and the input frequency:

$$G_{switchedcap}=C_1 f_{er} \quad \text{(Eq. 1)}$$

and the effective resistance of the structure is:

$$R_{switchedcap} = \frac{1}{C_1 \cdot f_{er}} \quad \text{(Eq. 2)}$$

Capacitor $C_2$ is placed at the output of the switched-capacitor structure to reduce the switching noise to the input $V_{sw}$ of comparator 58. The fixed current source 56 supplies a constant current I into the switched-capacitor circuit 52. Thus, the voltage $V_{sw}$ is equal to:

$$V_{sw}=R_{switchedcap} \cdot I \quad \text{(Eq. 3)}$$

If there is a sufficient difference between the frequencies of the VCO clock 6 and the frequency $f_{\phi ref}$ of the reference clock $\phi_{ref}$, i.e., if $f_{er}$ is sufficiently large, the edge detector 50 generates pulses at a high-frequency rate that result in high conductance/low resistance (Equations 1 and 2) of the switched-capacitor structure. The current source I 56 is adjusted such that for $f_{er}$ larger than a certain threshold, i.e., larger than the frequency capture range of the main data recovery loop, the switched-capacitor circuit 52 maintains the voltage $V_{sw}$ below the threshold of comparator 58. Thus, the comparator output $V_Q$ is held at 0. Referring back to FIG. 1, this value of $V_Q$ will direct selector 32 to allow the frequency acquisition circuit 4 to control the VCO 10.

When $f_{er}$ drops below a certain threshold, indicating that the VCO output frequency is within the data recovery capture range, the pulse rate of the edge detector 50 decreases such that the resistance of the switched-capacitor circuit 52 increases. The voltage $V_{sw}$ thus rises above the threshold of the comparator 58. The comparator output $V_Q$ becomes 1, and the selector 32 hands loop control to the data phase detector circuit 2.

The frequency acquisition circuit 4 will become active again, i.e., reselected, if the VCO frequency drifts away from the target frequency (that is, $f_{\phi ref}$, which is the same or very close to the expected data frequency) by more than a certain amount.

One major benefit of this embodiment is that it can be used with any type of data recovery loop circuit, independent of its architecture and data phase detector.

Figure 3:
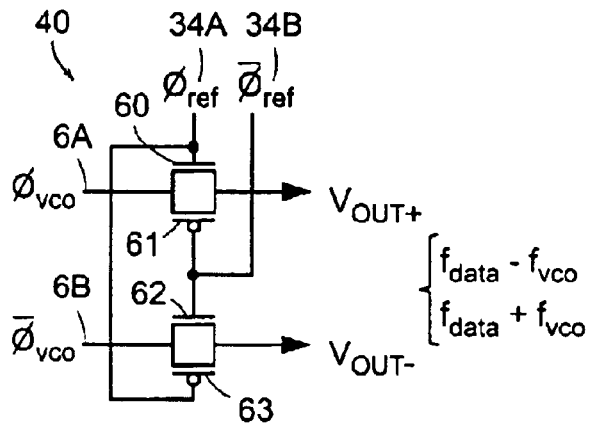
FIG. 3 is a schematic for the mixer of FIG. 2.

FIG. 3 is a circuit schematic for the mixer 40 of FIG. 2. A differential VCO output 6A, 6B is applied to transistors 60–63. A differential reference clock signal 34A, 34B is applied to the respectively to the gates of transistors 60 and 63, and 61 and 62. Note that the gate controls of transistors 61 and 63 are inverted. The effect is that $\phi_{vco}$ is modulated by $\phi_{ref}$, such that the differential output $V_{out}$ contains frequency components which are the sum and difference of the corresponding frequencies $f_{\phi vco}$ and $f_{\phi ref}$.

Figure 4:
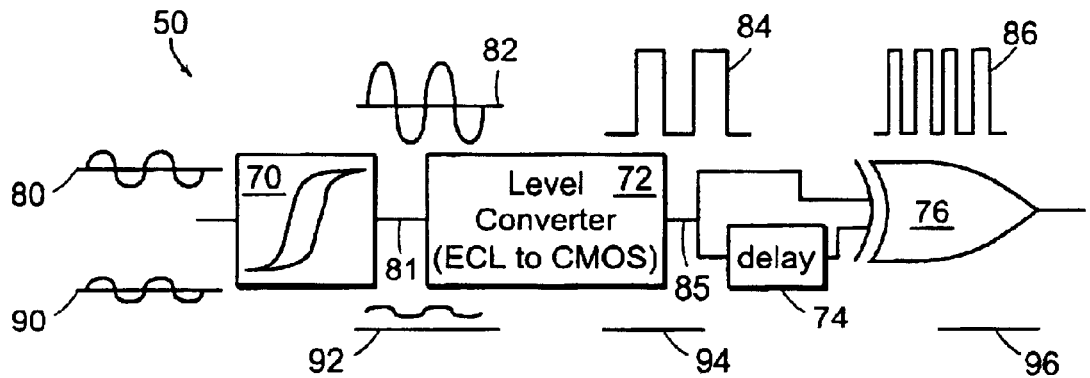
FIG. 4 is a simplified schematic diagram for the edge detector of FIG. 2.

FIG. 4 is a block diagram of the edge detector 50 of FIG. 2. As FIG. 4 illustrates, the edge detector 50 is designed to have a hysteresis characteristic 70, using positive feedback in its first stage amplifier 78. Thus, it reacts only to oscillation amplitudes larger than a certain threshold level. This helps to prevent erroneous transitions due to noise.

For example, at 80 is shown a signal oscillating with an amplitude larger than the necessary threshold level. The hysteresis circuit 70 magnifies the oscillations as shown at 82. A level converter 72 converts the oscillations to square pulses 84, while the combination of delay 74 and XOR gate 76 create a pulse for each transition of the output 85 of the level converter 72, as shown at 86.

On the other hand, at 90 is shown a noise signal with an amplitude which is less than the threshold level. Resulting waveforms shown at 92, 94 and 96 respectively, illustrate that the circuit does not respond to this noise 90.

Figure 5:
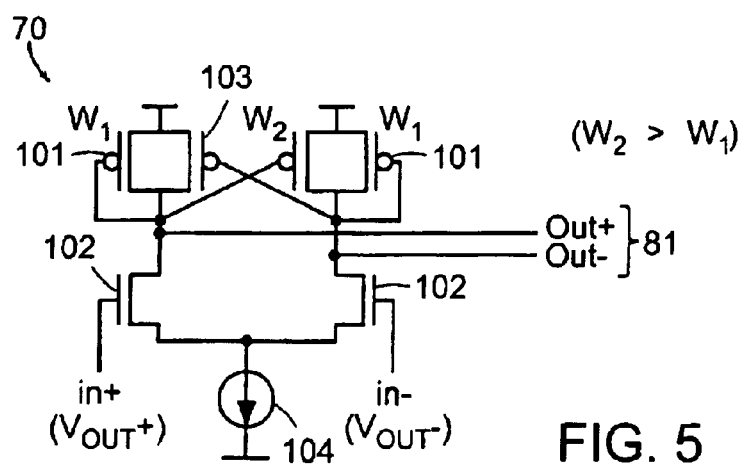
FIG. 5 is a schematic for the hysteresis circuit of FIG. 4.

FIG. 5 is a circuit schematic of the hysteresis circuit 70 of FIG. 4. Current source 104 draws current through the circuit. A differential front-end amplifier, comprising devices 102, modulates based on the input signal, which corresponds to the output $V_{out}$ of the mixer 28 of FIG. 3. A diode-connected PMOS device 101 in series with each input amplifier 102 acts as an active resistor. In parallel with each diode-connected device 101 is a second PMOS device 103 which is biased by a cross-coupling to the other side of the differential circuit, to provide positive feedback. To ensure hysteresis behavior in the front-end amplifier, i.e., devices 102, the size $W_2$ of the cross-coupled PMOS devices 103 should be larger than the size $W_1$ of the diode-connected PMOS devices 101.

The present invention can be used with any PLL regardless of its architecture. It can thus be used to recover the frequency information of random-pattern data, which is not possible using conventional phase-frequency detectors. In addition, this design is suitable for very high-speed application, as it operates at a much lower speed than the high-speed input signal, and can be implemented using standard CMOS technology. Another benefit is that the overall architecture requires a very low transistor count and complexity.

Figure 6:
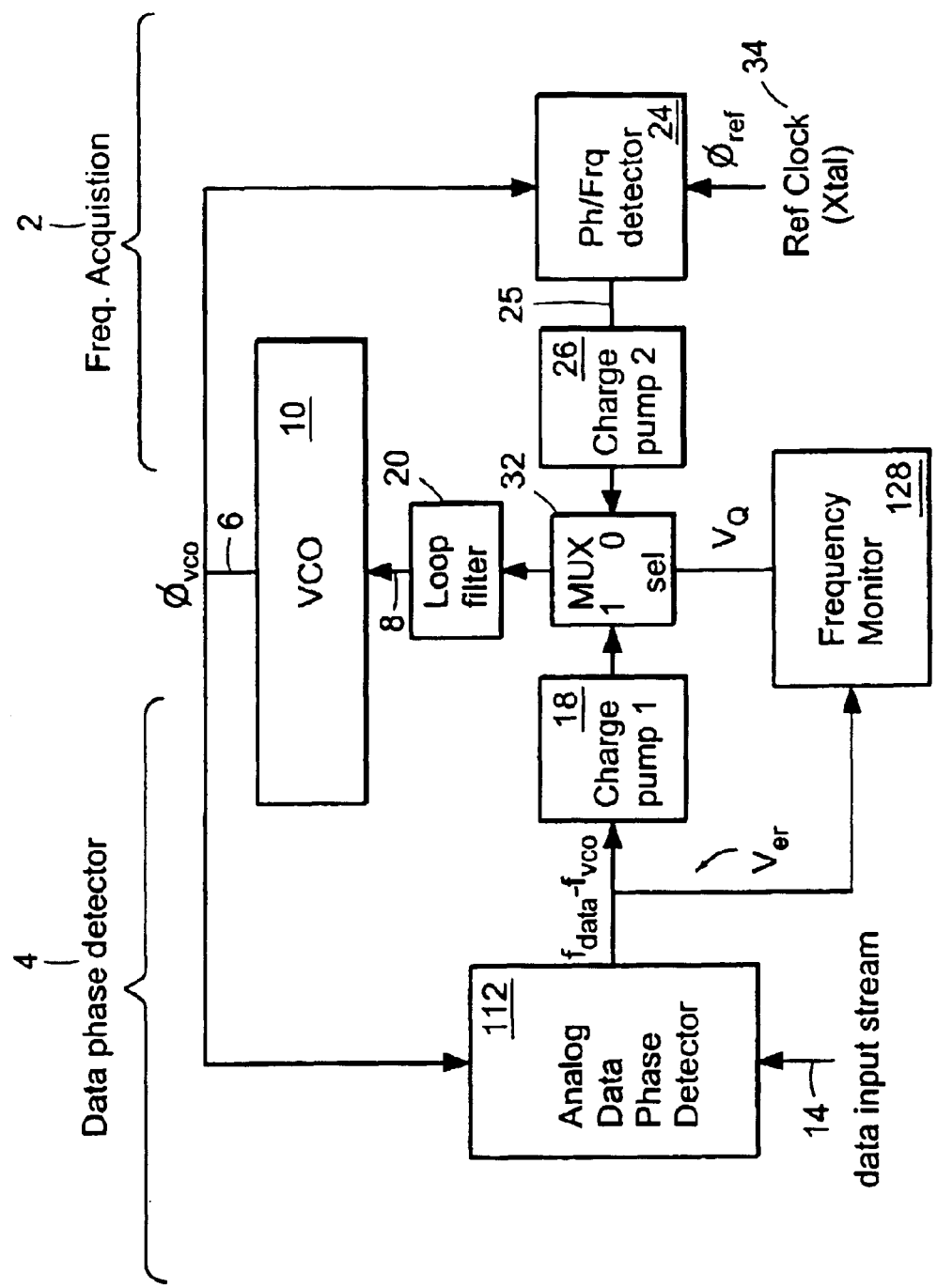
FIG. 6 is a block diagram of a combined phase detector and frequency acquisition loop, with the frequency monitor of an alternate embodiment of the present invention.
Figure 7:
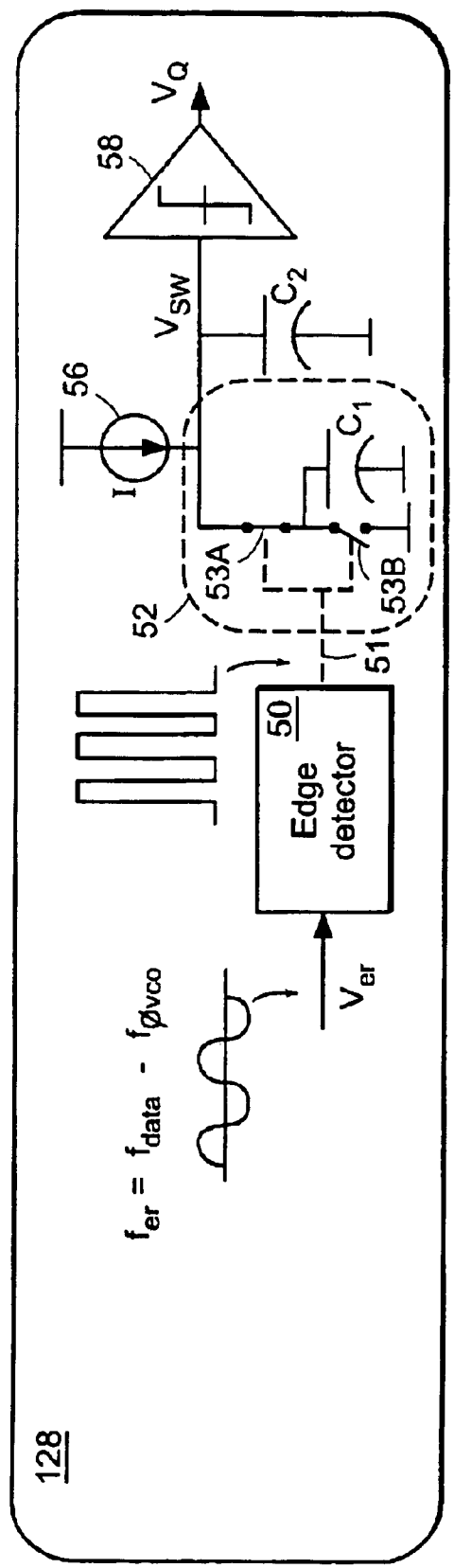
FIG. 7 is a simplified schematic diagram for the frequency monitor of FIG. 6.

A second embodiment is illustrated in FIGS. 6 and 7. In this embodiment, the frequency monitor 28 uses cycle-slipping information from an analog data phase detector 112 to indicate when the VCO's output frequency is different from that of the incoming data. Such an analog data phase detector is described in a U.S. Patent Application Ser. No. 09/862,384, filed on the even day herewith, entitled "A LIEAR DATA PHASE RECOVER DETECTOR" to Ramin Faijad-Raj.

During cycle-slipping, sweeping of the VCO clock phases over the data stream causes the phase detector output $V_{er}$ to oscillate between "early" and "late" signals. The frequency of this oscillation (sweep speed) is equal to the frequency difference between the receive clock and the incoming data.

This $V_{er}$ can be used directly by a frequency monitor 128 which is appropriately modified from that of FIGS. 1 and 2. Thus, in this embodiment, the frequency monitor 128 does not need direct access to the VCO output 6 and the reference clock 34.

FIG. 7 is a block diagram of the modified frequency monitor 128. It is essentially the same as that of FIG. 2, with the exception that the mixer and low-pass filter are no longer needed.

While this invention has been particularly shown and described with references to preferred embodiments thereof, it will be understood by those skilled in the art that various changes in form and details may be made therein without departing from the scope of the invention encompassed by the appended claims.

What is claimed is:

1. A frequency monitor, comprising:
   an edge detector which produces an output comprising a pulse for each rising/falling edge of an error signal, the error signal having a frequency responsive to a difference between frequencies of two input signals;
   a conductive circuit having an effective resistance depending on a rate of the edge detector output pulses, wherein the conductive circuit comprises a switched capacitor circuit which charges and discharges at a rate that depends on the rate of the edge detector output pulses;
   a capacitor which holds a charge responsive to the effective average resistance of the conductive circuit, and
   an indicator circuit which produces an output responsive to the charge held by the capacitor.

2. The frequency monitor of claim 1, wherein the indicator circuit comprises:
   a comparator that produces the indicator circuit output, said output being at one of two levels based on the charge and a threshold, a first level indicating that the difference between the two input signal frequencies is less than a predetermined amount, and the second level indicating that said difference is greater than a predetermined amount.

3. A frequency monitor, comprising:
   an edge detector which produces an output comprising a pulse for each rising/falling edge of an error signal, the error signal having a frequency responsive to a difference between frequencies of two input signals;
   a conductive circuit having an effective resistance depending on a rate of the edge detector output pulses, wherein the conductive circuit comprises a switched capacitor circuit which charges and discharges at a rate that depends on the rate of the edge detector output, pulses;
   a capacitor which holds a charge responsive to the effective average resistance of the conductive circuit;
   an indicator circuit which produces an output responsive to the charge held by the capacitor; and
   a selector which, responsive to the indicator circuit output, selects from plural sources to control an oscillator.

4. The frequency of claim 3, wherein the oscillator is a voltage-controlled oscillator.

5. The frequency monitor of claim 3, wherein the plural sources are a data phase detector circuit and a frequency acquisition circuit.

6. The frequency monitor of claim 5, wherein the oscillator produces a cloak signal at a sampling frequency, the clock signal being used by the detector circuit to receive data.

7. The frequency monitor of claim 6, wherein the frequency acquisition circuit compares the clock signal with a reference clock to produce a frequency acquisition output indicative of a difference between the frequencies of the reference clock and the oscillator clock signal, said output being one of the sources to the selector.

8. The frequency monitor of claim 6, wherein the data phase detector circuit compares the clock signal with a rate of incoming data to produce a data phase detector output indicative of a difference between the frequencies of the reference clock and the incoming data, said output being one of the sources to the selector.

9. The frequency monitor of claim 8, wherein the data phase detector circuit output comprises the error signal.

10. A frequency monitor, comprising:
    a combiner circuit which combines two input signals to produce an error signal, the error signal having a frequency responsive to a difference between frequencies of the two input signals, wherein the combiner circuit comprises a mixer which mixes the two input signals to produce a mixed signal; and a low-pass filter which filters the mixed signal to produce the error signal;
    an edge detector which produces an output comprising a pulse for each rising/falling edge of the error signal;
    a conductive circuit having an effective resistance depending on a rate of the edge detector output pulses;
    a capacitor which holds a charge responsive to the effective average resistance of the conductive circuit;
    an indicator circuit which produces an output responsive to the charge held by the capacitor.

11. A method for monitoring frequency, comprising:
    producing an output comprising a pulse for each rising/falling edge of the error signal, the error signal having a frequency responsive to a difference between frequencies of two input signals;
    charging a capacitor to a charge responsive to the frequency of the error signal;
    indicating, responsive to the charge held by the capacitor, whether a difference between the two input signal frequencies is less than a predetermined amount; and using a switched capacitor circuit to charge the capacitor, the switched capacitor circuit having an effective resistance that depends on error signal frequency.

12. A method for monitoring frequency, comprising:

producing an output comprising a pulse for each rising/falling edge of an error signal, the error signal having a frequency responsive to a difference between frequencies of two input signals;

charging a capacitor to a charge responsive to the error signal frequency;

indicating responsive to the charge held by the capacitor, whether a difference between the two input signal frequencies is less than a predetermined amount;

selecting, responsive to the step of indicating, from plural sources to control an oscillator; and combining the two input signals to produce the error signal.

13. The method of claim 12, wherein the oscillator is a voltage-controlled oscillator.

14. The method of claim 12, wherein the plural sources are a data phase detector circuit and a frequency acquisition circuit.

15. The method of claim 14, wherein the oscillator produces a clock signal at a sampling frequency, the clock signal being used by the detector circuit to receive data.

16. The method of claim 15, wherein the frequency acquisition circuit compares the clock signal with a reference clock to produce a frequency acquisition output indicative of a difference between the frequencies of the reference clock and the oscillator clock signal, said output being one of the sources to the selector.

17. The method of claim 15, wherein the data phase detector circuit compares the clock signal with a rate of incoming data to produce a data phase detector output indicative of a difference between the frequencies of the reference clock and the incoming data, said output being one of the sources to the selector.

18. The method of claim 17, wherein the data phase detector circuit output comprises the error signal.

19. A method for monitoring frequency, comprising:

combining two input signals to produce an error signal, the error signal having a frequency responsive to a difference between frequencies of two input signals, comprising mixing the two input signals to produce a mixed signal; and filtering, with a low-pass filter, the mixed signal to produce the error signal;

producing an output comprising a pulse for each rising/falling edge of the error signal;

charging a capacitor to a charge responsive to the error signal frequency; and indicating, responsive to the charge held by the capacitor, whether a difference between the two input signal frequencies is less than a predetermined amount.

20. The frequency monitor of claim 3, wherein the indicator circuit comprises:

a comparator that produces the indicator circuit output, said output being at one of two levels based on the charge and a threshold, a first level indicating that the difference between the two input signal frequencies is less than a predetermined amount, and the second level indicating that said difference is greater than a predetermined amount.

21. A frequency monitor comprising:

an edge detector which produces an output comprising a pulse for each rising/falling edge of an error signal, the error signal having a frequency responsive to a difference between frequencies of two input signals;

a conductive circuit having an effective resistance depending on a rate of the edge detector output pulses;

a capacitor which holds a charge responsive to the effective average resistance of the conductive circuit;

an indicator circuit which produce responsive to the charge held by the capacitor;

a combiner circuit which combines the two input signals to produce the error signal; and a selector which, responsive to the indicator circuit output, selects from plural sources to control an oscillator.

22. The frequency monitor of claim 21, wherein the combiner circuit comprises:

a mixer which mixes the two input signals to produce a mixed signal; and a low-pass filter which filters the mixed signal to produce the error signal.

23. The method of claim 12, further comprising:

using a switched capacitor circuit to charge the capacitor, the switched capacitor circuit having an effective resistance that depends an error signal frequency.

24. A frequency monitor comprising:

an edge detector which produces an output comprising a pulse for each rising/falling edge of an error signal, the error signal having a frequency responsive to a difference between frequencies of two input signals;

a conductive circuit having an effective resistance depending on a rare of the edge detector output pulses wherein the conductive circuit comprises a switched capacitor circuit which charges and discharges at a rate that depends on the rate of the edge detector output pulses;

a capacitor which holds a charge responsive to the effective average resistance of the conductive circuit; and an indicator circuit which produces an output responsive to the charge held by the capacitor.

25. The frequency monitor of claim 10, wherein the indicator circuit comprises:

a comparator that produces the indicator circuit output, said output being at one of two levels based on the charge and a threshold, a first level indicating that the difference between the two input signal frequencies is less then a predetermined amount, and the second level indicating that said difference is greater than a predetermined amount.

26. A method for monitoring frequency, comprising:

combining two input signals to produce an error signal, the error signal having a frequency responsive to a difference between frequencies of two input signals;

producing an output comprising a pulse for each rising/falling edge of the error signal;

charging a capacitor to a charge responsive to the error signal frequency;

using a switched capacitor to charge the capacitor, the switched capacitor having an effective resistance that depends on error signal frequency; and indicating responsive to the charge held by the capacitor, whether a difference between the two input signal frequencies is less than a predetermined amount.

* * * * *